(12) United States Patent
Goto

(10) Patent No.: US 7,084,081 B2
(45) Date of Patent: Aug. 1, 2006

(54) DISPLAY DEVICE AND METHOD OF MANUFACTURING THE SAME

(75) Inventor: Yasumasa Goto, Saitama-ken (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 10/996,409

(22) Filed: Nov. 26, 2004

(65) Prior Publication Data

US 2005/0158903 A1    Jul. 21, 2005

(30) Foreign Application Priority Data

Nov. 27, 2003    (JP)    ............................ P2003-398085

(51) Int. Cl.
*H01L 21/26*    (2006.01)
(52) U.S. Cl. ................. 438/795; 257/75; 257/E33.003; 257/E21.133
(58) Field of Classification Search ................. 438/795; 257/75, 51, E33.003, E21.133
See application file for complete search history.

(56) References Cited

U.S. PATENT DOCUMENTS 6,479,837 B1* 11/2002 Ogawa et al. ................. 257/59

2002/0070381 A1* 6/2002 Yamada et al. ................. 257/59
2004/0060504 A1* 4/2004 Takeda et al. ................. 117/84

FOREIGN PATENT DOCUMENTS

| JP | 11-121751 | 4/1999 |
|---|---|---|
| JP | 2000-133807 | 5/2000 |
| JP | 2000-243968 | 8/2000 |
| JP | 2000-243969 | 8/2000 |

* cited by examiner

*Primary Examiner*—Caridad Everhart
(74) *Attorney, Agent, or Firm*—Oblon, Spivak, McClelland, Maier & Neustadt, P.C.

(57) ABSTRACT

A display device includes a display area composed of pixels in a matrix. Each pixel has a light-emitting element and a driving element to supply a driving current to the light-emitting element. The driving element includes a thin film transistor with a semiconductor layer of a poly-crystalline film. The semiconductor layer is provided with channel region, and a source and drain region disposed on both sides of the channel region. The channel region connects the source region to the drain region and has at least two conductive regions with different average grain sizes. The characteristics of the driving elements are made substantially uniform so that the display quality of the display device can be improved remarkably.

15 Claims, 8 Drawing Sheets

DISPLAY DEVICE AND METHOD OF MANUFACTURING THE SAME

FIELD OF THE INVENTION

This invention relates to a display device and a method of manufacturing the same and, more particularly, to a light-emitting type display device with a light-emitting element provided for every pixel and a method of manufacturing the same.

CROSS-REFERENCE TO RELATED APPLICATIONS

This application is based upon and claims the benefit of priority from the prior Japanese Patent Application No. 2003-398085, filed on Nov. 27, 2003, the entire contents of which are incorporated in this application by reference.

BACKGROUND OF THE INVENTION

Recently, a light-emitting type flat panel display, such as an organic electroluminescence (EL) display device, has been widely noticed. Such an organic EL display device, for example, consists of a large number of pixels, each of which is provided with a fine organic EL display element.

The organic EL display device has the following advantages:

(1) Since the EL display element is a light-emitting type, a bright and sharp display with a wide viewing angle can be achieved.

(2) No rear light source is required so that the display device is thin in thickness and light in weight.

(3) Since the display device can be driven by a direct current, it is not subjected to noises.

(4) A response speed of the EL display elements is fast in the order of μsec so that smooth motion pictures can be reproduced.

(5) Since the EL display element is a solid-state light-emitting device, it is possible to widen a service temperature range.

For the advantages as described above, the EL display device has been aggressively developed.

On the other hand, an active matrix display device provided with poly-crystalline-silicon thin-film transistors has been already put into a practical use. A poly-crystalline-silicon semiconductor layer for thin-film transistors is made of a poly-crystalline-silicon film into which an amorphous-silicon film formed on a substrate is re-crystallized and to which a prescribed patterning process is then applied.

There are prior art laser-annealing methods in which pulsed-laser beams are irradiated to melt and re-crystallize an amorphous-silicon film into a poly-crystalline-silicon film. According to Japanese Unexamined Patent Publication No. Hei 11-121751, for instance, laser beam scanning directions are consistent with the width direction of a channel region of the semiconductor layer to prevent discontinuities at the semiconductor layer of pixel-switching transistors (disconnections between channel regions and source/drain regions of thin-film transistors) caused in a liquid crystal display device.

One of the prior art laser annealing methods teaches that a longitudinal direction of gate electrodes of thin-film transistors is perpendicular to that of crystalline grains to obtain uniform-property pixel-switches used in a liquid crystal display device (as described in Japanese Unexamined Patent Publication No. 2000-243969, for instance). Another prior art laser annealing method describes that a longitudinal direction of gate electrodes of thin-film transistors is at an angle of 45° with respect to that of crystalline grains (as pointed out in Japanese Unexamined Patent Publication No. 2000-243968, for instance).

Where these prior art methods are applied to an active matrix type liquid crystal display device, even though there is more or less dispersion in grain diameters of silicon crystals constituting semiconductor layers for pixel switches, improvements in their switching properties can be expected. In the case of an active matrix type light-emitting display device, however, the dispersion in grain diameters of the silicon crystals may cause the display device uneven brightness.

Such an active matrix type light-emitting display device is provided with pixel switching elements and driving elements to control a driving current of light-emitting elements in response to video signals supplied through the pixel switching elements. Where both pixel switching and driving elements are composed of thin-film transistors, the semiconductor layers of which are made of poly-crystalline-silicon films, the dispersion in crystallinity of silicon of the driving elements, particularly, results in different carrier mobility in their channel regions. Thus, even though the light-emitting elements are driven by means of substantially the same-level-video signals, dispersion occurs in driving-current-supply capability of the driving elements. In the case of uniform image display, high and low bright pixels are mixed up so that the image quality may become deteriorated.

The dispersion in crystallinity of silicon is most likely to be caused by the following reasons. Although a poly-crystalline-silicon film is formed by irradiating laser beams to melt an amorphous-silicon film and then by crystallizing the same, the crystallinity of such a poly-crystalline-silicon is finally determined by the shot of irradiated laser beams. In other words, the laser beam power is supposedly set to be uniform but some shots of the irradiated laser beams are actually higher or lower in power than the remaining ones of the irradiated laser beams. Such irregular power shots of the irradiated laser beams may make the crystallinity of silicon different.

Since the driving elements connected in series with the light-emitting devices are, however, disposed in the same location as in the row pixels perpendicular to a scanning direction of the laser beams, each of these driving elements has a poly-crystalline-silicon film finally formed by the same shot of laser beam. Thus, the driving elements disposed in the direction perpendicular to the scanning direction of laser beams have substantially the same mobility but those disposed in the scanning direction of laser beams have some dispersion in mobility.

Since high mobility driving elements are highly capable of supplying currents to the light-emitting diodes, the brightness of the light-emitting diodes driven by the high mobility driving elements becomes high, and vice versa. Thus, the mobility of driving elements depends on the shots used for making the poly-crystalline-silicon films of the driving elements and the brightness of the light emitting diodes has dispersion in accordance with the shots so that line-like uneven brightness appears to extend in the direction perpendicular to the scanning direction of the laser beams.

As described in detail above, some thin-film transistors provided with semiconductor layers made from poly-crystalline-silicon films to drive light-emitting elements have certain differences in crystallinity of silicon due to irregular power shots of laser beams in an annealing process to form the poly-crystalline-silicon films. The differences in crystalline silicon give rise to different magnitudes of driving currents supplied to light-emitting elements under the same level of voltage. Such different magnitudes of driving currents cause uneven brightness among pixels.

SUMMARY OF THE INVENTION

Accordingly, the present invention provides a display device with driving elements capable of supplying a uniform driving current to light-emitting elements and a method of manufacturing the same.

The first aspect of the present invention is directed to a method of manufacturing a display device with driving elements for driving pixels which carries out preparing an amorphous-silicon film formed on a substrate, irradiating pulsed-laser beams toward the amorphous-silicon film while shifting to shoot each of the same in a predetermined scanning direction to form a poly-crystalline film, patterning the poly-crystalline film to include at least two poly-crystalline conductive regions in a channel region finally formed by different shots of the laser beams, and forming source and drain regions on both sides of the channel region, respectively, whereby the channel, source and drain regions are provided in a semiconductor layer of each of the driving elements.

The second aspect of the present invention is directed to a method of manufacturing a display device with driving elements for driving pixels which carries out preparing an amorphous-silicon film formed on a substrate, irradiating pulsed-laser beams toward the amorphous-silicon film while shifting to shoot each of the same by a predetermined pitch in a predetermined scanning direction to form a poly-crystalline film, patterning the poly-crystalline film to make a width of the poly-crystalline film wider than the pitch, and forming a channel region, and source and drain regions on both sides of the channel region, respectively, in a direction substantially perpendicular to the scanning direction.

The third aspect of the present invention is directed to a display device provided with a display area having pixels disposed in a matrix, light-emitting elements provided for the pixels, and driving elements to supply driving currents to the light-emitting elements. The driving elements have thin-film transistors with semiconductor layers of poly-crystalline films. The semiconductor layers includes source, drain and channel regions. The channel region connects the source and drain regions and includes at least two conductive regions with different average grain sizes.

The present invention can provide a display device with driving elements capable of supplying more uniform driving current to light-emitting elements and a method of manufacturing such a display device.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DESCRIPTION OF THE EMBODIMENTS

Embodiments of the present invention will be explained below with reference to the attached drawings. By way of example, the embodiments of the present invention are applied to an organic EL display device as a display device. It should be noted, however, that the present invention is not limited to the embodiments but covers their equivalents. Throughout the attached drawings, similar or the same reference numerals show similar, equivalent or same components.

Figure 1:
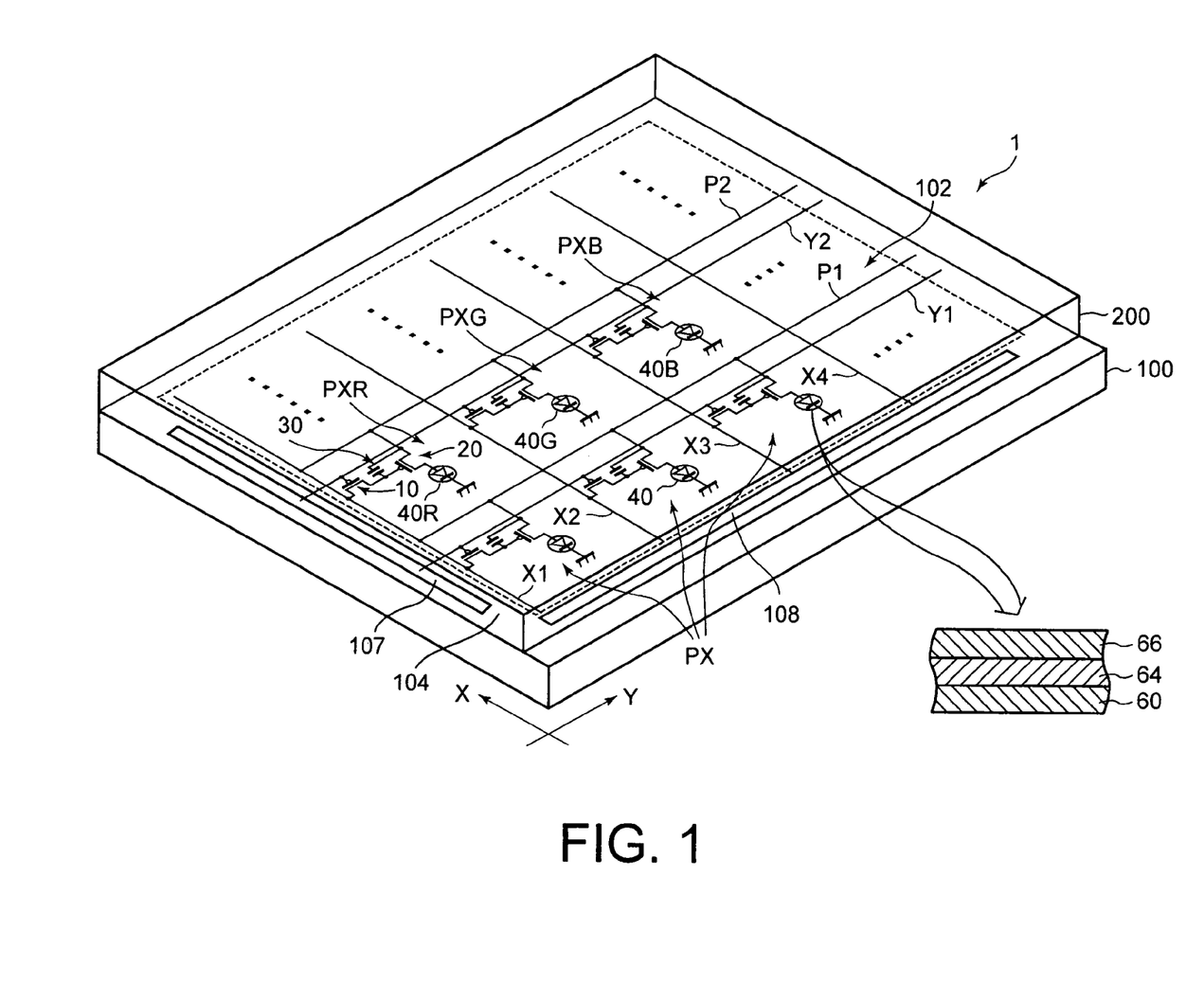
FIG. 1 is a schematic perspective view of an organic EL display device in accordance with the first embodiment of the present invention.

As shown in FIG. 1, organic EL display device 1 includes a circuit array substrate 100 with display area 102. Pixels PX such as those PXR, PXG and PXB are arranged in a matrix in display area 102. At least display area 102 of circuit array substrate 100 is tightly sealed by sealing member 200.

Each pixel PXR, PXG or PXB is provided with pixel switch 10, driving element 20 and capacitor element 30. Pixel switch 10 holds a video signal supplied to its pixel when it is turned on and prevents the video signal from being supplied to its pixel when it is turned off. Driving element 20 controls a driving current supplied to a light-emitting (display) element in response to the video signal.

Capacitor element 30 is connected between gate and source electrodes of driving element 20 and maintains a voltage between them to be constant. Pixel switch 10 and driving element 20 are composed of p-channel thin-film transistors with semiconductor layers made from poly-crystalline-silicon films, for instance.

Further, each pixel PX is provided with organic EL display element 40. That is, red, green and blue color pixels PXR, PXG and PXB include organic EL display elements 40R, 40G and 40B to emit red, green and blue light, respectively.

Red, green and blue color pixels PXR, PXG and PXB are basically the same in structure. Organic EL display elements 40 are disposed in a matrix and composed of the first electrodes 60 isolated in an island-like pattern from each other, the second electrode 66 commonly provided for all pixels PX and facing the first electrodes 60, and organic active layers 64 held between the first and second electrodes 60 and 66.

The first electrodes 60 are made of optically transparent materials, such as indium-tin-oxide (ITO) films or indium zinc oxide (IZO) films and function as anode electrodes.

Organic active layers 64 include at least light-emitting organic compounds and may be made of three layers of hole and electron buffer layers commonly provided for three colors and an organic light-emitting layer provided for each of three colors, two functionally composite layers or a single layer. The hole buffer layer is provided between the anode electrode and the organic light-emitting layer and made from an aromaticamine derivative film, polythiophene derivative film or polyamine derivative film. The organic light-emitting layer is made of an organic compound to emit red, green or blue light. The organic compound in the case of the adoption of a polymer system is made of a polyparaphenylene vinylene derivative film, polyfluorene derivative film or its precursor film, for instance.

The second electrode 66 is made of a metal film with a function capable of injecting electrons, such as Al (aluminum), Ba (barium), Ag (silver) or Yb (ytterbium), and function as a cathode electrode. The second electrode 66 may be a double-layer structure of a surface of the cathode metal film coated with a cover metal. Further, the surface of the second electrode 66 may be also coated with a hygroscopic desiccating agent material.

Circuit array substrate 100 is provided with scanning lines Ym, (m=1, 2, . . . ,) disposed along line directions (i.e., the Y direction shown in FIG. 1), signal lines Xn, (n=1, 2, . . . ,) disposed along row directions (i.e., the X direction shown in FIG. 1) perpendicular to scanning lines Ym, and power supply lines Pm, (m=1, 2, . . . ) to supply power to the first electrodes 60 of organic EL display elements 40 through driving elements 20. The second electrodes 66 of organic EL display elements 40 are connected to the second electrode power lines not shown but arranged at circumference locations of display area 102 for supplying a common reference or ground potential.

Circuit array substrate 100 is further provided in circumference area 104 along outer sides of display area 102 with scanning-line-drive circuit 107 to supply scanning signals to scanning lines Ym and signal-line-drive circuit 108 to supply video signals to signal lines Xn. All scanning and signal lines Ym and Xn are connected to scanning and signal-line-drive circuit 107 and 108, respectively.

Pixel switches 10 are disposed in the vicinities of crossing points of scanning lines Ym and signal lines Xn. Gate electrodes of pixel switches 10 are connected to scanning lines Ym while source and drain electrodes of pixel switches 10 are connected to signal lines Xn, and one electrode of capacitor elements 30 as well as gate electrodes of driving elements 20, respectively. Source and drain electrodes of driving elements 20 are connected to power supply lines Pm and the other electrodes of capacitor elements 30, and the first electrodes 60 of organic EL display elements 40, respectively.

In organic EL display device 1, electrons and holes are injected into organic active layer 64 held between the first and second electrodes 60 and 66 of each pixel PX of organic EL display element 40, the recombination of those electrons and holes generates excitons and organic EL display element 40 emits light as a result of release of light with a predetermined wavelength at the time when the excitons lose their energy. The light is projected from the upper side, i.e., from the side of the second electrode 66 (an upper-surface light-emitting system).

Figure 2:
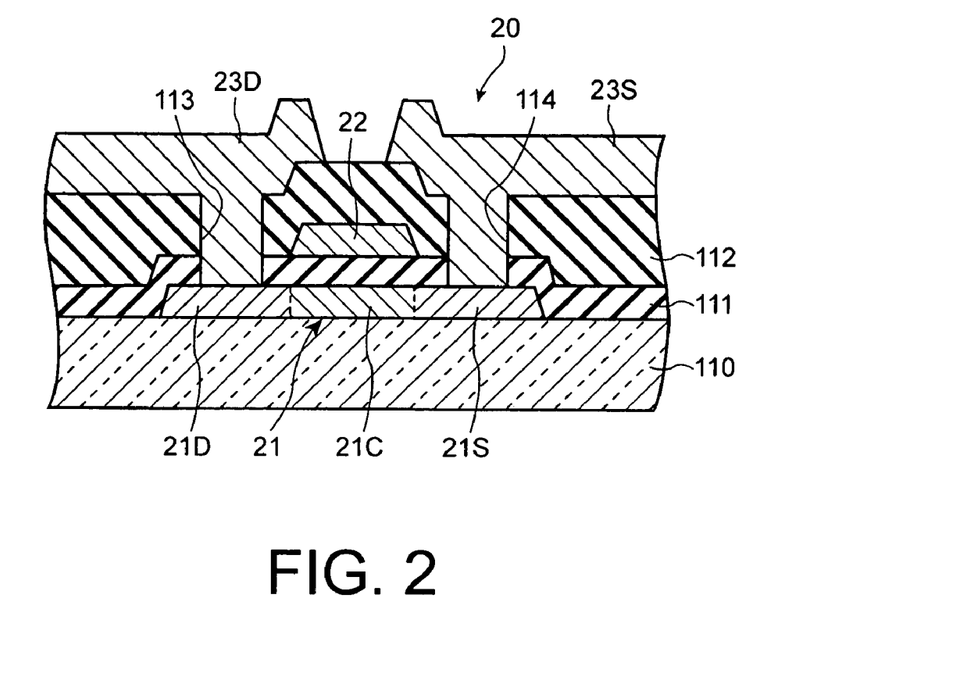
FIG. 2 is a cross-sectional view of a driving element provided in each pixel of the organic EL display device shown in FIG. 1.

Driving element 20 arranged in each pixel PX has semiconductor layer 21 made from a poly-crystalline-silicon film as shown in FIG. 2. Semiconductor layer 21 is formed on insulation substrate 110, such as a glass substrate of circuit array substrate 100, or on an undercoating layer made of nitride or oxide film deposited on insulation substrate 110. Semiconductor layer 21 has channel region 21C and impurity-doped drain and source regions 21D and 21S on both sides of channel region 21C, and is covered with gate insulation film 111.

Gate electrode 22 of driving element 20 is disposed exactly over channel region 21C through gate insulation film 111. Gate electrode 22 of driving element 20 is covered with interlayer insulation film 112.

Drain electrode 23D is electrically connected to drain region 21D through contact hole 113 made through gate insulation film 111 and interlayer insulation film 112. Source electrode 23S is electrically connected to source region 21S through contact hole 114 made through gate insulation film 111 and interlayer insulation film 112.

Figure 3:
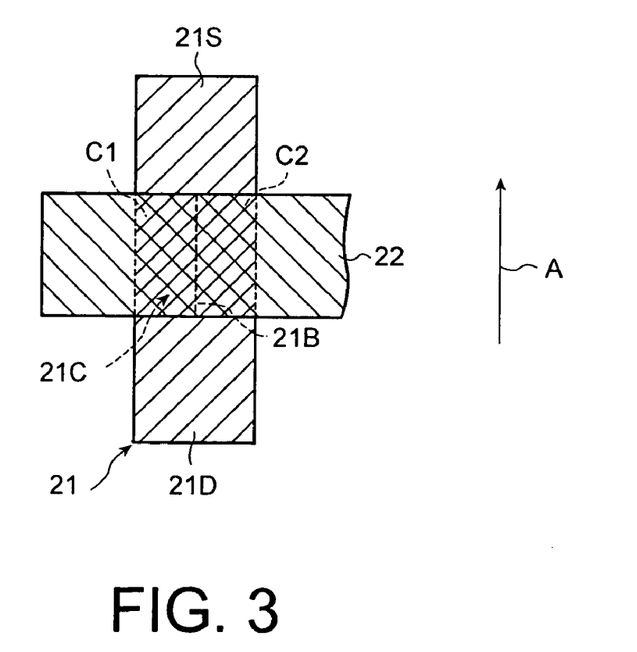
FIG. 3 is a schematic plan view of a semiconductor layer applicable to the driving element shown in FIG. 2.
Figure 4:
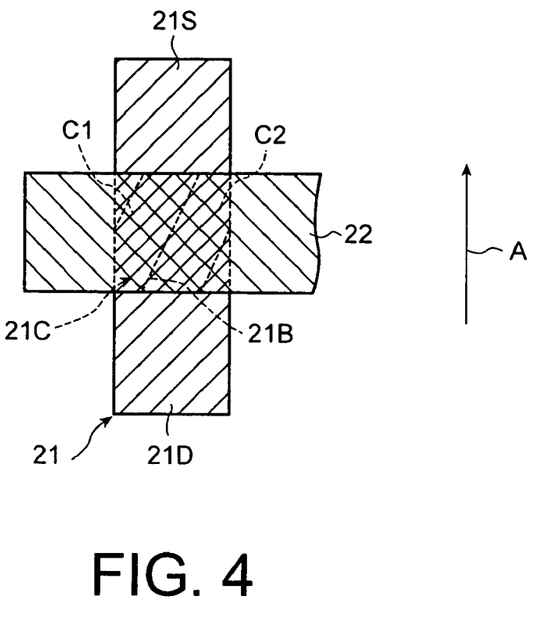
FIG. 4 is a schematic plan view of another semiconductor layer applicable to the driving element shown in FIG. 2.

Channel region 21C is provided with at least two conductive regions C1 and C2 to electrically connect source and drain regions 21S and 21D as shown in FIGS. 3 and 4. That is, these conductive regions C1, C2, . . . are composed of at least two poly-crystalline-silicon regions formed by irradiating pulsed-laser beams to anneal amorphous-silicon films for re-crystallization and by different final shooting of the laser beams.

Averaged grain diameters of silicon crystals (i.e., crystallinity) for channel region 21C are determined by irradiating the final shots of laser beams. Thus, if there is dispersion in power of finally irradiated laser beams when poly-crystalline-silicon regions C1, C2, . . . are formed, their crystallinity is different from each other. In other words, channel region 21C has two conductive regions C1, C2, . . . with different average grain diameters to connect source and drain regions 21S and 21D.

Each of conductive regions C1, C2, . . . included in channel region 21C may be of any configurations to connect source and drain regions 21S and 21D.

As shown in FIG. 3, for instance, each of conductive regions C1, C2, . . . may be a configuration extending along longitudinal direction A of channel region 21C (or the longitudinal direction of semiconductor layer 21) and may be in parallel with the source-drain direction. In this case, boundary 21B between two adjacent conductive regions C1 and C2 is substantially in parallel with longitudinal direction A of channel region 21C.

As shown in FIG. 4, each of conductive regions C1, C2, . . . may be a configuration which does not extend in parallel with longitudinal direction A of channel region 21C (or the longitudinal direction of semiconductor layer 21). In this case, boundary 21B between two adjacent conductive regions C1 and C2 is at a slant with respect to longitudinal direction A of channel region 21C.

Those structures provide the inside of channel region 21C with conductive regions C1, C2, . . . of a plurality of mobility differences so that the mobility of channel region 21C can be averaged out as a whole even if every poly-crystalline-silicon region consisting each conductive region has different crystallinity. Thus, a capability for driving elements 20 to supply organic EL display elements 40 with driving currents can be also averaged out. This can result in an improvement in dispersion of current-supply capabilities of driving elements 20 in the case that organic EL display elements 40 are driven by the same level of video signals. Accordingly, when a uniform image is displayed, brightness differences between pixels can be reduced to improve their display quality.

Figure 5:
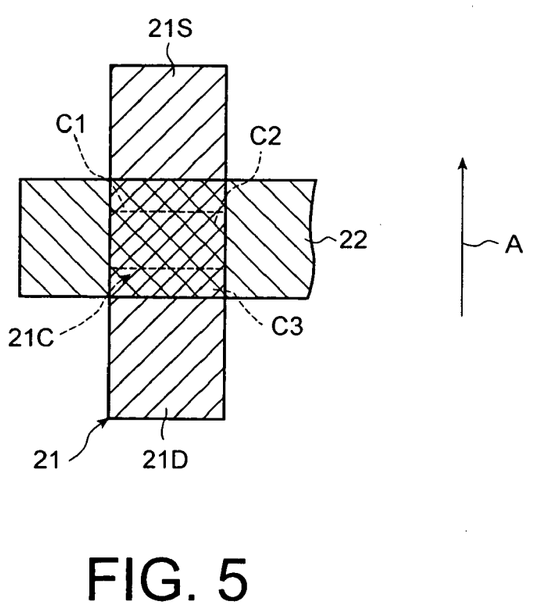
FIG. 5 is a schematic plan view to explain rate-control of mobility.

As shown in FIG. 5, it is undesirable that each of conductive regions C1, C2, . . . is not a configuration which connects source and drain regions 21S and 21D, i.e., that each of conductive regions C1, C2, . . . is substantially perpendicular to longitudinal direction A of channel region 21C. When different silicon crystallinity makes even one of conductive regions C1, C2, . . . small in mobility as shown in FIG. 5, resistance between source and drain regions is governed by that mobility.

In the case of such silicon crystallinity, the capabilities of driving elements 20 to supply currents are not averaged out but their dispersion rather increases. In short, channel region 21C requires at least two conductive regions C1, C2, . . . to connect source and drain regions 21S and 21D.

Next, a method of manufacturing the display device set forth above will be described. Here, the first manufacturing method to form semiconductor layer 21 of driving element 20 will be explained below.

Figure 6:
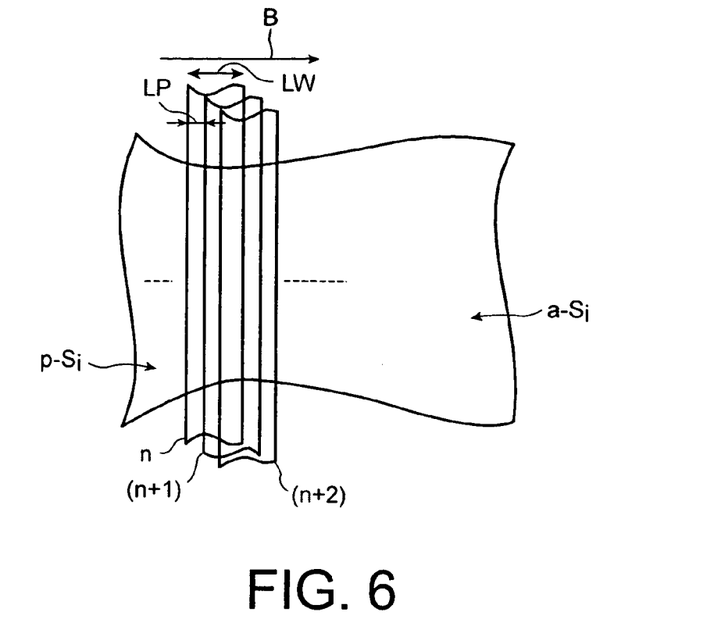
FIG. 6 is a schematic plan view to explain a laser annealing process in the first method of manufacturing the semiconductor shown in FIG. 3.

First, an amorphous-silicon-film-formed substrate is prepared. As shown in FIG. 6, pulsed-laser beams are then irradiated to amorphous-silicon film a-Si in scanning direction (shot-moving direction) B. Heating energy of the laser beams melts amorphous-silicon film a-Si and re-crystallizes to make the same poly-crystalline. Thus, poly-crystalline-silicon film p-Si is formed.

In this laser annealing process, all areas of amorphous-silicon film a-Si are uniformly heated by substantially the same heating energy. Each laser beam is approximately rectangular in cross section so that scanning direction B is shorter than the direction perpendicular to scanning direction B. Every laser beam is irradiated while being shifted by pitch LP along scanning direction B.

Figure 7:
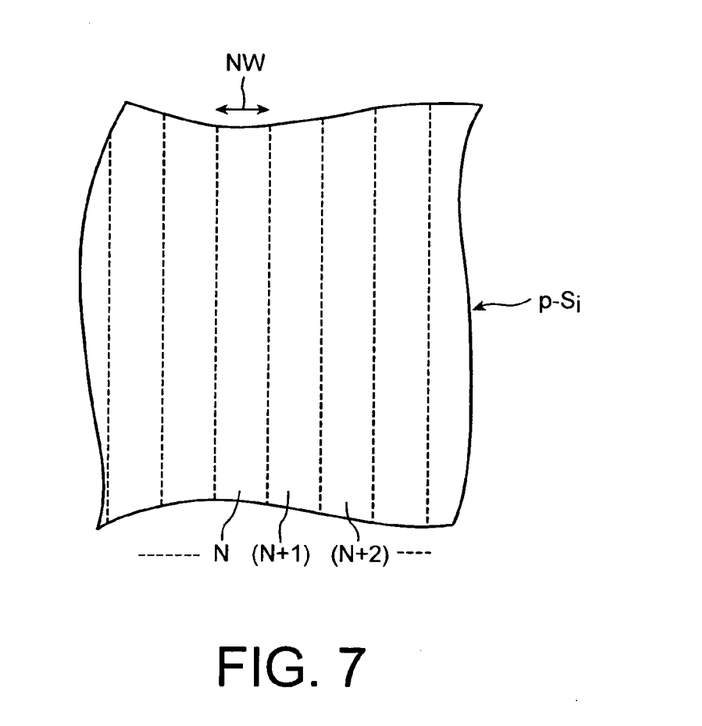
FIG. 7 is a schematic plan view of poly-crystalline-silicon regions of a poly-crystalline-silicon film made by the laser annealing process shown in FIG. 6.

As shown in FIGS. 6 and 7, poly-crystalline-silicon regions N, (N+1), (N+2), . . . are eventually formed by finally irradiated-laser-beam shots n, (n+1), (n+2), . . . , respectively. Width LW is defined between adjacent poly-crystalline-silicon regions corresponds to laser-beam pitch LP. The width direction is consistent with scanning direction B of the laser beams.

Where width LW and pitch are 100 μm and 5 μm, for instance, respectively, every 20-shot-laser beam is irradiated to form a poly-crystalline-silicon film over all the area of channel region 21C. In other words, a series of the laser beams from the initial (n−19)-th shot though the final n-th shot are irradiated to form poly-crystalline-silicon region N in this particular case.

Laser beam scanning may be carried out to form a poly-crystalline film by shifting of a laser-beam-irradiation position at a predetermined pitch with respect to a fixed substrate with an amorphous-silicon film formed or by shooting laser beams to an amorphous-silicon-film formed substrate which moves at a predetermined speed. In the latter case, where timing of irradiating the laser beams is kept at a regular interval, troublesome adjustments are not required for a position of the substrate with respect to the laser beams so that it can improve laser annealing efficiency.

Figure 8:
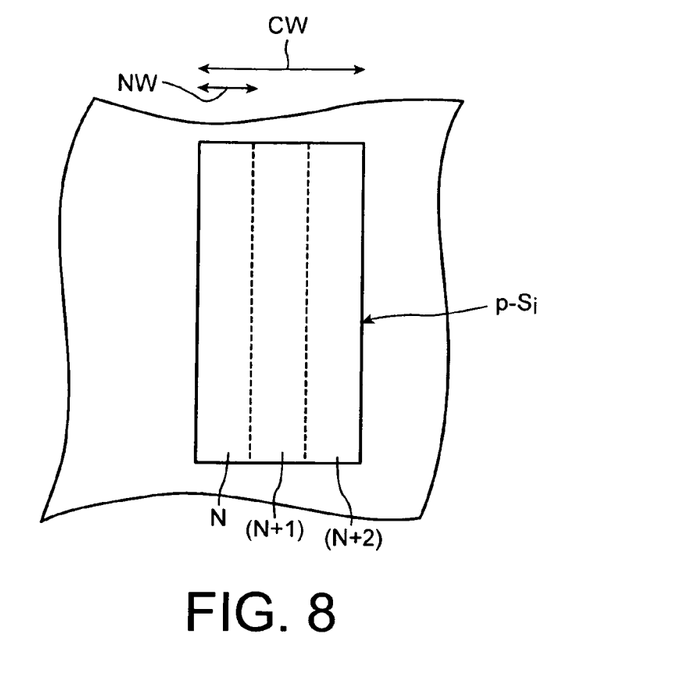
FIG. 8 is a schematic plan view of a patterned poly-crystalline-silicon film formed in accordance with the first method of manufacturing the semiconductor.

Subsequently, as shown in FIG. 8, a patterning process is carried out for poly-crystalline-silicon film p-Si to include at least two consecutive poly-crystalline-silicon regions N and (N+1), (N+1) and (N+2), or . . . formed by different final shots of the laser beams, respectively. In short, poly-crystalline-silicon film p-Si is patterned to include at least parts of two adjacent ones of poly-crystalline-silicon regions N, (N+1), . . . in the patterning process.

Further, the patterning process may make width CW of poly-crystalline-silicon film p-Si wider than pitch LP of the laser beams, i.e., width NW of poly-crystalline-silicon region N, (N+1), (N+2), or . . . . Thus, patterned poly-crystalline-silicon film p-Si consistently includes at least two poly-crystalline-silicon regions N and (N+1), (N+1) and (N+2), or . . .

Desirably, width NW of poly-crystalline-silicon region N, (N+1), (N+2), or . . . (i.e., pitch LP of the laser beams) is set to be not more than half of width CW of poly-crystalline-silicon film p-Si. This makes patterned poly-crystalline-silicon film p-Si have not less than two poly-crystalline-silicon regions N and (N+1), (N+1) and (N+2), or . . . .

In the case that width NW of poly-crystalline-silicon region N, (N+1), (N+2), or . . . and width CW of patterned poly-crystalline-silicon film p-Si are set to be 5 μm and 15 μm, respectively, for instance, as shown in FIG. 8, patterned poly-crystalline-silicon film p-Si includes three poly-crystalline-silicon regions N, (N+1) and (N+2) or more.

Figure 9:
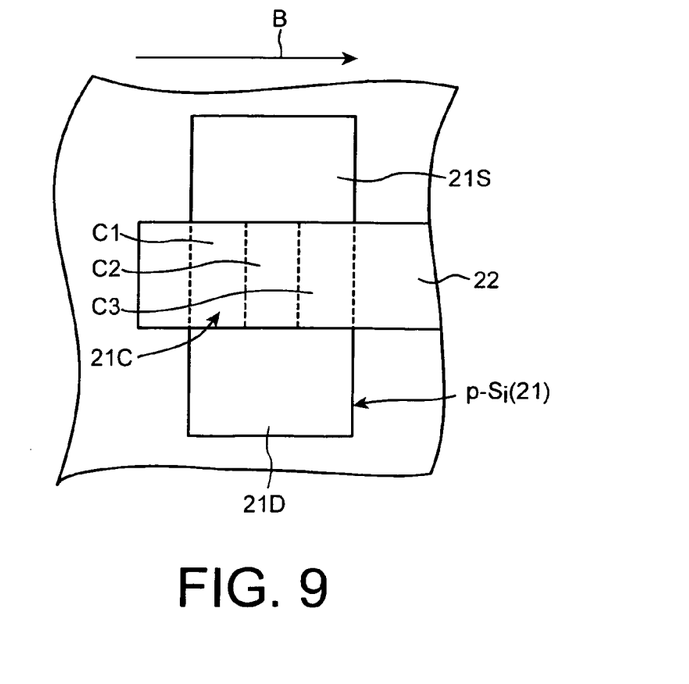
FIG. 9 is a schematic plan view of source and drain regions of the semiconductor formed in accordance with the first method of manufacturing the semiconductor.

Next, as shown in FIG. 9, semiconductor layer 21 is completed with source and drain regions 21S and 21D formed on both sides of channel region 21C of poly-crystalline-silicon film p-Si as follows: First, patterned poly-crystalline-silicon film p-Si is covered with the gate insulation film. Second, gate electrode 22 is formed over poly-crystalline-silicon film p-Si. Finally, an impurity is doped into poly-crystalline-silicon film p-Si through gate electrode 22 as a mask.

Thus, source and drain regions 21S and 21D are formed on both sides of channel region 21C of poly-crystalline-silicon film p-Si in a direction substantially perpendicular to scanning direction B. Neither source region 21S nor drain region 21D is overlapped with gate electrode 22.

Channel region 21C is provided with conductive regions C1, C2, C3, . . . composed of poly-crystalline-silicon regions N, (N+1), (N+2), . . . , respectively. Each of conductive regions C1, C2, C3, . . . is formed to couple source region 21S with drain region 21D. As described above, conductive region C1 is composed of poly-crystalline-silicon region N made finally by the n-th shot of the laser beams. Likewise, conductive region C2 is composed of poly-crystalline-silicon region (N+1) made finally by the (n+1)-th shot of the laser beams.

In order to form conductive regions C1, C2, C3, . . . in channel region 21C, scanning direction B of the laser beams is required not to be perpendicular to a direction along width CW of channel region 21C. In the first embodiment of the present invention, scanning direction B is, in fact, in parallel with the direction along width CW of channel region 21C.

Power dispersion in laser beam shots of the laser anneal process gives rise to different crystallinity of poly-crystalline-silicon regions formed in conductive regions. A method of manufacturing a display device according to the first embodiment, however, forms a plurality of conductive regions C1, C2, C3, . . . with different mobility in channel region 21C so that the mobility of channel region 21C can be averaged as a whole. Thus, an averaged driving current can be supplied from driving element 20 to organic EL display element 40. Accordingly, where organic EL display elements 40 are supplied with substantially the same magnitude video signals, organic EL display elements 40 emit substantially the same magnitude light to display uniform images so that their display quality can be significantly improved.

Further, a patterning process is carried out for poly-crystalline-silicon film p-Si formed by at least two different final shots of the laser beams. Practically, such a patterning process is performed to make predetermined width CW of poly-crystalline-silicon film p-Si wider than pitch LP of the laser beams so that channel region 21C can include at least two consecutive ones out of conductive regions C1, C2, . . . . Particularly, channel region 21C includes more than two conductive regions C1, C2, C3, . . . in the case that pitch LP is set to be not more than half of width CW of channel 21C. Thus, even where the mobility of each conductive region is different, total mobility of channel region 21C can be averaged better.

Second Embodiment

Next, a method of manufacturing semiconductor layer 21 of driving element 20 in accordance with the second embodiment of the present invention will be described below. However, detailed explanations of the same processes as in the first embodiment are omitted.

First,.an amorphous-silicon film-formed substrate is prepared. As schematically shown in FIG. 10, pulsed-laser beams are then irradiated to amorphous-silicon film a-Si and shifted by pitch LP in scanning (shot-moving) direction B.

Figure 10:
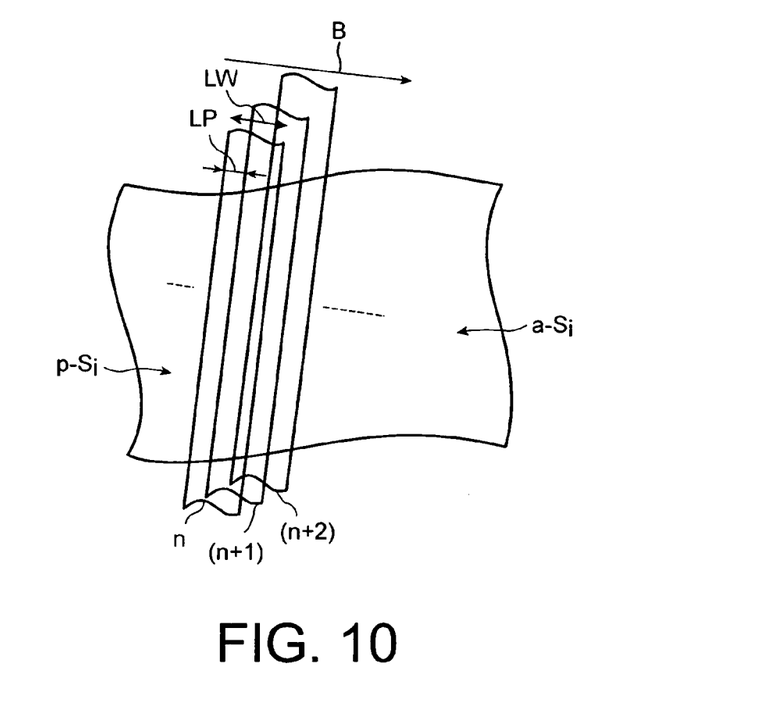
FIG. 10 is a schematic plan view to explain the second method of manufacturing the semiconductor shown in FIG. 3.
Figure 11:
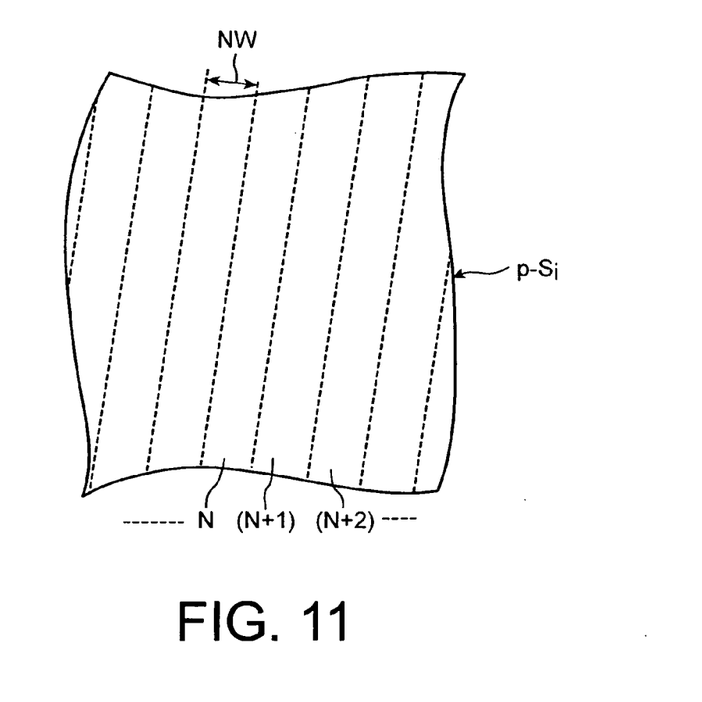
FIG. 11 is a schematic plan view of poly-crystalline-silicon regions of a poly-crystalline-silicon film made by the laser annealing process in the second method of manufacturing the semiconductor shown in FIG. 10.

As shown in FIGS. 10 and 11, poly-crystalline-silicon regions N, (N+1), (N+2), . . . are eventually formed by finally irradiated-laser-beam shots n, (n+1), (n+2), . . . , respectively. Width NW defined between adjacent poly-crystalline-silicon regions corresponds to laser-beam pitch LP. The width direction is consistent with scanning direction B of the laser beams.

Figure 12:
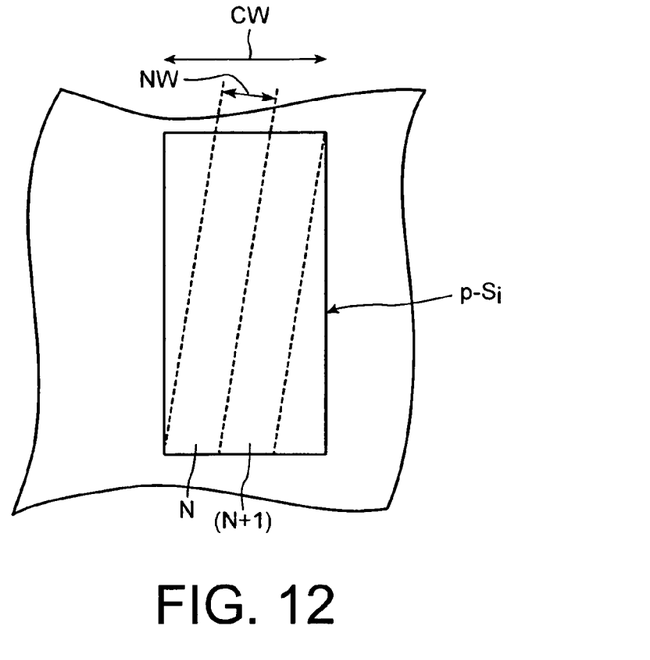
FIG. 12 is a schematic plan view of a patterned poly-crystalline-silicon film formed in accordance with the second method of manufacturing the semiconductor.

Subsequently, as shown in FIG. 12, a patterning process is carried out for poly-crystalline-silicon film p-Si to include at least two consecutive poly-crystalline-silicon regions N and (N+1), (N+1) and (N+2), or . . . formed by different final shots of the laser beams, respectively.

Further, the patterning process may make width CW of poly-crystalline-silicon film p-Si wider than pitch LP of the laser beams, i.e., width NW of the poly-crystalline-silicon region. Thus, patterned poly-crystalline-silicon film p-Si securely includes at least two consecutive poly-crystalline-silicon regions N and (N+1), (N+1) and (N+2), or . . . .

Desirably, width NW of the poly-crystalline-silicon region (pitch LP of the laser beams) is set to be not more than half of width CW of poly-crystalline-silicon film p-Si. This makes patterned poly-crystalline-silicon film p-Si have not less than two poly-crystalline-silicon regions N and (N+1), (N+1) and (N+2), or . . . .

Figure 13:
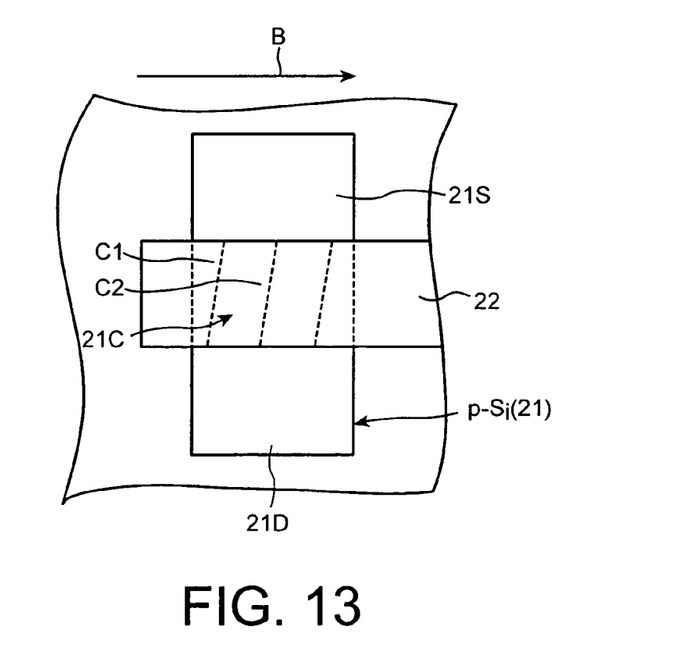
FIG. 13 is a schematic plan view of source and drain regions of the semiconductor formed in accordance with the second method of manufacturing the semiconductor.

Next, as shown in FIG. 13, semiconductor layer 21 is completed with source and drain regions 21S and 21D formed on both sides of channel region 21C of poly-crystalline-silicon film p-Si as follows: First, patterned poly-crystalline-silicon film p-Si is covered with the gate insulation film. Second, gate electrode 22 is formed over poly-crystalline-silicon film p-Si. Finally, an impurity is doped into poly-crystalline-silicon film p-Si through gate electrode 22 as a mask.

Thus, source and drain regions 21S and 21D are formed on both sides of channel region 21C of poly-crystalline-silicon film p-Si which are substantially perpendicular to scanning direction B and which are not overlapped with gate electrode 22.

Channel region 21C is provided with conductive regions C1, C2, C3, . . . composed of poly-crystalline-silicon regions N, (N+1), (N+2), . . . , respectively. Each of conductive regions C1, C2, C3, . . . is formed to couple source region 21S with drain region 21D. As described above, conductive region C1 is composed of poly-crystalline-silicon region N made finally by the n-th shot of the laser beams. Likewise, conductive region C2 is composed of poly-crystalline-silicon region (N+1) made finally by the (n+1)-th shot of the laser beams.

In order to form conductive regions C1, C2, C3, . . . in channel region 21C, scanning direction B of the laser beams is required not to be perpendicular to a direction along width CW of channel region 21C. In the second embodiment of the present invention, scanning direction B is, in fact, at a slant with respect to the direction along width CW of channel region 21C.

According to the second embodiment, in addition to the effects provided by the first embodiment, where the driving element of each pixel is formed at substantially the same location, each of the driving elements of pixels disposed in the line and row directions of the display area does not have a poly-crystalline-silicon film formed by the same final shot. In other words, the driving elements of pixels disposed in slant directions have poly-crystalline-silicon films formed by the same last shots. Thus, the driving elements of the second embodiment can make it more difficult to visualize line-like uneven brightness possibly formed in the line and row directions of the display area than those of the first embodiment.

Meanwhile, in the case of a color organic EL display device, the visual sensitivity (relative luminous efficiency) of human eyes depends on displayed colors. Where color displays are made by red color pixels PXR, green color pixels PXG and blue color pixels PXB, the visual sensitivity of green color is higher than that of the other colors. Thus, uneven display of the green color (in the case of an entirely green color display) is particularly conspicuous.

Accordingly, it is desirable to set a ratio of width CW of channel region 21C to width NW of each conductive region C1, C2, . . . with respect to a green color (the first color) pixel to be different from that of width CW of channel region 21C to width NW of each conductive region C1, C2, . . . with respect to a red or blue color pixel (the second color pixel).

Width NW of each conductive region is set to be not more than CW/3, for instance, with respect to width CW of channel region 21C for the green color pixel while width NW of each conductive region is set to be not more than CW/2 with respect to width CW of channel region 21C for the red or blue color pixel. In order to configure these structures, a predetermined pitch of the laser beams to form the green color pixels is smaller than that of the laser beams to form the red or blue color pixels. Alternatively, a width of the semiconductor layer for the green color pixel is larger than that of the semiconductor for the red or blue color pixel.

Thus, three conductive regions or more are provided in the channel region for the green color pixel but two conductive regions or more are provided in the channel region for the red or blue color pixel. As a result, dispersion in mobility of the channel region for the green color pixel is averaged better than that in mobility of the channel region for the red or blue color pixel. Accordingly, uneven brightness of a higher visual-sensitivity color (e.g., green color) can be improved.

Figure 14:
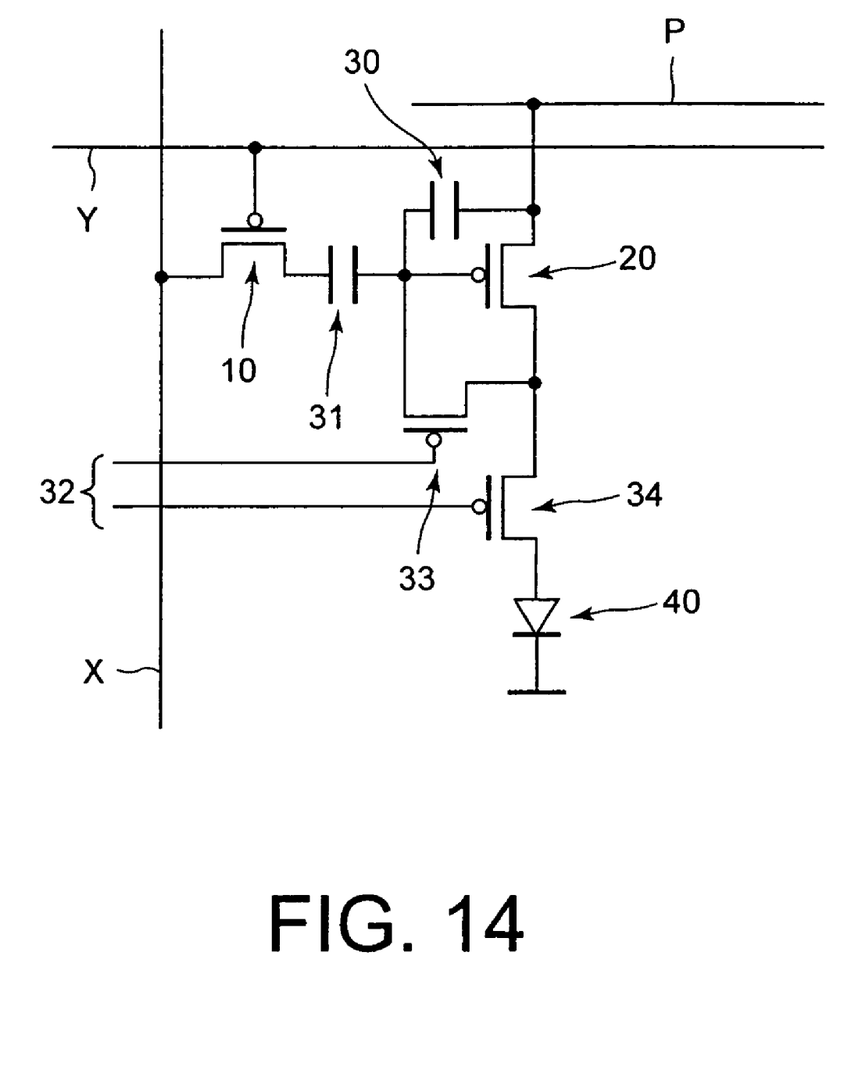
FIG. 14 is a circuit diagram of a circuit to cancel dispersion in threshold values.

This invention is applied not only to the circuit arrangement shown in FIG. 1 but also to other circuit arrangements, such as the one shown in FIG. 14, for example, in which circuits to cancel threshold dispersion are built. Particularly, in order to cancel the threshold dispersion, this circuit arrangement includes capacitor element 31 connected between pixel switch 10 and accumulation capacitor element 30, and control elements 33 and 34 connected to control lines 32.

Since the circuit arrangement, however, also includes pixel switch 10, driving element 20 and control elements 33 and 34, the semiconductor layers of which are composed of a poly-crystalline-silicon film, it cannot cancel the mobility dispersion completely. Where the semiconductor layer of driving element 20 in the circuit arrangement is made of such a poly-crystalline-silicon film as set forth above in the first and second embodiment, the mobility dispersion can be significantly averaged.

As described above, direction (longitudinal direction) A of channel region 21C of driving element 20 to supply a driving current to organic EL display element 40 is perpendicular to scanning (shot-moving) direction B of the laser beams and channel region 21C is composed of conductive regions C1, C2, . . . to connect channel region 21C to source and drain regions 21S and 21D.

Even if average grain diameters of conductive regions C1, C2, . . . are different from each other, since conductive regions C1, C2, . . . are parallel with a source-drain direction, the mobility is not governed by that of one of conductive regions C1, C2, . . . . Thus, a capability for driving element 20 to supply a driving current to organic EL display element 40 can be averaged. Therefore, it can reduce brightness differences between pixels when a uniform image is displayed and improve display quality.

The present invention is not limited to the embodiments described above. Although the invention has been described in its applied form with a certain degree of particularity, it is understood that the present disclosure of the preferred form can be changed in the details of construction and the combination and arrangement of components may be resorted to without departing from the spirit and the scope of the invention as hereinafter claimed. Some components of the embodiments may be eliminated or various components from different embodiments may also be combined.

What is claimd is:

1. A method of manufacturing a display device with driving elements for driving pixels, comprising:
    preparing an amorphous-silicon film formed on a substrate;
    irradiating pulsed-laser beams toward said amorphous-silicon film while shifting to shoot each of the same in a scanning direction to form a poly-crystalline film;
    patterning said poly-crystalline film to include at least two poly-crystalline conductive regions in a channel region finally formed by different shots of said laser beams; and
    forming source and drain region on both sides of said channel region,
    wherein said scanning direction of said laser beams is substantially not in parallel with a longitudinal direction of said channel region,
    whereby said channel, source and drain regions are provided in a semiconductor layer of each of said driving elements.

2. A method of manufacturing a display device according to claim 1, wherein said scanning direction of said laser beams is substantially in parallel with a width direction of said channel region.

3. A method of manufacturing a display device according to claim 1, wherein said scanning direction of said laser beams is at a slant with respect to a width direction of said channel region.

4. A method of manufacturing a display device according to claim 1, wherein said pixels include first and second pixels, and a ratio of a width of each of said conductive region in said first pixel to that of said channel region in said first pixel is different from a ration of a width of each of said conductive region in said second pixel to that of said channel region in said second pixel.

5. A method of manufacturing a display device with driving elements for driving pixels, comprising:
    preparing an amorphous-silicon film formed on a substrate;
    irradiating pulsed-laser beams toward said amorphous-silicon film while shifting to shoot each of the same by a predetermined pitch in a scanning direction to form a poly-crystalline film;
    patterning said poly-crystalline film to make a width of said poly-crystalline film wider than said pitch; and
    forming a channel region and source and drain regions on both sides of said channel region in a direction substantially perpendicular to said scanning directions,
    wherein said scanning direction of said laser beams is substantially not in parallel with a longitudinal direction of said channel region.

6. A method of manufacturing a display device according to claim 5, wherein said pitch is not more than half of a width of said channel region.

7. A method of manufacturing a display device according to claim 5, wherein the scanning direction of said laser beams is substantially in parallel with a direction of a width of said channel region.

8. A method of manufacturing a display device according to claim 5, wherein the scanning direction of said laser beams is at a slant with respect to a direction of a width of said channel region.

9. A method of manufacturing a display device according to claim 5, wherein said channel region includes at least first and second conductive regions connecting said source region to said drain region,
    said first conductive region is finally formed by a first shot of said laser beams, and
    said second conductive region is finally formed by a second shot of said laser beams which is subsequent to said first shot of said laser beams.

10. A method of manufacturing a display device according to claim 9, wherein said pixels include first and second pixels, and a ratio of a width of each of said conductive region in said first pixel to that of said channel region in said first pixel is different from a ration of a width of each of said conductive region in said second pixel to that of said channel region in said second pixel.

11. A display device comprising:
    a display area having pixels disposed in a matrix;
    light-emitting elements provided for, and corresponding to, said pixels; and
    driving elements to supply driving currents to said light-emitting elements,
    said driving elements having thin-film transistors with semiconductor layers of poly-crystalline films,
    said semiconductor layers including source, drain and channel regions, and
    said channel region connecting said source and drain regions and including at least two conductive regions with different average grain sizes, said at least two conductive regions have a boundary which is substantially not in parallel with a width direction of said channel region.

12. A display device according to claim 11, wherein said conductive regions have a boundary which is substantially in parallel with a longitudinal direction of said channel region.

13. A display device according to claim 11, wherein said conductive regions have a boundary which is at a slant with respect to a longitudinal direction of said channel region.

14. A display device according to claim 11, wherein said pixels include first and second pixels, and a ratio of a width of each of said conductive region in said first pixel to that of said channel region in said first pixel is different from a ration of a width of each of said conductive region in said second pixel to that of said channel region in said second pixel.

15. A display device according to claim 11, wherein said semiconductor layers are formed by irradiating pulsed-laser beams to anneal amorphous crystalline films, and said conductive regions are formed by different final shots of said laser beams.

* * * * *